United States Patent [19]

Yamaha

[11] Patent Number: 5,036,382
[45] Date of Patent: Jul. 30, 1991

[54] SEMICONDUCTOR DEVICE HAVING A MULTI-LEVEL WIRING STRUCTURE

[75] Inventor: Takahisa Yamaha, Shizuoka, Japan

[73] Assignee: Yamaha Corporation, Shizuoka, Japan

[21] Appl. No.: 482,566

[22] Filed: Feb. 21, 1990

[30] Foreign Application Priority Data

Feb. 22, 1989 [JP] Japan .................................. 1-42846

[51] Int. Cl.[5] ............................................ H01L 23/54
[52] U.S. Cl. ......................................... 357/71; 357/67
[58] Field of Search ................................. 357/67, 71

[56] References Cited

U.S. PATENT DOCUMENTS

| | | | |
|---|---|---|---|
| 3,614,547 | 10/1971 | May | 357/67 |
| 4,782,380 | 11/1988 | Shanker et al. | 357/71 |
| 4,824,803 | 4/1989 | Us et al. | 357/67 |
| 4,843,453 | 6/1989 | Hooper et al. | 357/71 |
| 4,910,580 | 3/1990 | Kuecher et al. | 357/71 |

OTHER PUBLICATIONS

"Barrier Layer Metallurgy for Aluminum Stripes'-—Herdzik et al., IBM Technical Disclosure Bulletin, vol. 10, No. 12, May 1968, p. 1979.
Article—Comparison of Electromigration Phenomenon—Between Aluminum Interconnection of Various Multilayered Materials Jun. 12-13, 1989 VMIC Conference pp. 477-483.

Primary Examiner—Rolf Hille
Assistant Examiner—Sheila V. Clark
Attorney, Agent, or Firm—Joseph W. Price

[57] ABSTRACT

A multi level wiring structure incorporated in a semiconductor device has a wiring layer sandwiched between insulating films and coupled to upper and lower conduction paths through contact windows formed in the insulating films, respectively, and the wiring layer is implemented by an aluminum-silicon alloy film sandwiched between upper and lower barrier films formed of a conductive substance selected from the group consisting of a refractory metal silicide, a refractory metal and a refractory metal alloy, and the barrier films are operative to prevent undesirable recrystallized silicon precipitates from direct contacting the upper and lower conduction paths, so that the wiring layer is kept well conductive with respect to the upper and lower conduction paths.

19 Claims, 3 Drawing Sheets

SEMICONDUCTOR DEVICE HAVING A MULTI-LEVEL WIRING STRUCTURE

FIELD OF THE INVENTION

This invention relates to a semiconductor device and, more particularly, to a multi-level wiring structure incorporated in the semiconductor device for provision of an electric conduction path.

DESCRIPTION OF THE RELATED ART

Since the beginning of the integrated circuit era, the minimum device dimension has been shrunk to the submicron order at a fairly large annual rate. When the minimum device dimension was shrunk, the contact windows were also reduced in the area, and, contact spiking became a serious problem. In particular, if aluminum wiring was brought into contact with a shallow impurity region formed in the silicon substrate, an aluminum spiking or a junction spiking penetrated the shallow impurity region and, accordingly, provided undesirable conduction path between the aluminum wiring and the silicon substrate. For providing a solution, the aluminum wiring was replaced with an aluminum-silicon alloy wiring. This solution was effective against the aluminum spiking, however, another problem was encountered in the miniature contact window. This problem was related to recrystallization of the silicon doped into the aluminum. In practice, the silicon was added to the aluminum beyond the solubility of silicon with respect to the aluminum, and the excess silicon tended to be recrystallized in the miniature contact window while the substrate was subjected to a heat treatment at 350 degrees to 550 degrees in centigrade at the later stage. This undesirable silicon precipitate formed nonohmic contact between the aluminum alloy wiring and the impurity region, and, for this reason, the resistance was increased due to the silicon precipitate.

One of the approaches to solve the problem due to the recrystallized silicon precipitate is provision of a barrier film of a refractory metal silicide. Referring to FIG. 1 of the drawings, an n-type impurity region 1 is formed in a p-type silicon substrate 2, and a lowest silicon oxide film 3 covers the major surface of the silicon substrate 2. A contact window 4 is formed in the lowest silicon oxide film, and a barrier film 5 of a conductive refractory metal silicide extends along the contact window 4, and the barrier film 5 is overlain by a lower wiring strip 6 of an aluminum-silicon alloy. The barrier film 5 and the lower wiring strip 6 form in combination a lower film structure 7. The lower film structure 7 is covered with an inter level insulating film 8 of phosphosilicate glass where another contact window 9 is formed. An upper wiring strip 10 of aluminum is formed on the inter level insulating film 8, and is brought into ohmic contact with the lower film structure 7.

This solution is effective against the recrystallized silicon precipitates 11 and 12 produced along the periphery of the contact window 4, because the barrier film 5 provides a fairly conductive path over the contact window 4. However, the recrystallized silicon precipitates are produced not only in the contact window but also beneath the upper wiring strip 10. Such a recrystallized silicon precipitate 13 is causative of increasing the contact resistance between the upper wiring strip 10 and the lower film structure 7. Moreover, a recrystallized silicon precipitate 14 deteriorates the resistivity of the lower film structure 7, and causes undesirable electromigrations to take place in the lower wiring strip 6.

SUMMARY OF THE INVENTION

It is therefore an important object of the present invention to provide a semiconductor device the wiring structure of which is free from the problems due to the recrystallized silicon precipitates.

To accomplish these objects, the present invention proposes to sandwich an aluminum/aluminum alloy strip between two conductive refractory metal silicide films.

In accordance with one aspect of the present invention, there is provided a semiconductor device fabricated on a semiconductor substrate of a first conductivity type and having at least a transistor and a multi level wiring structure, the multi level wiring structure comprising a plurality of conductive paths, and a plurality of insulating layers each inserted between two of the conductive paths and having a contact window for providing an inter level conduction path between aforesaid two of the conduction paths, in which at least one of the conduction paths has a metal film formed of a substance selected from the group consisting of aluminum and an aluminum alloy, lower and upper barrier films sandwiching the metal film and formed of a conductive substance selected from the group consisting of a refractory metal silicide, a refractory metal and a refractory metal alloy.

In accordance with another aspect of the present invention, there is provided a multi level wiring structure incorporated in a semiconductor device fabricated on a semiconductor substrate, comprising a) a plurality of conductive paths, and b) a plurality of insulating layers each inserted between two of the conductive paths and having a contact window for providing an inter level conduction path between aforesaid two of the conduction paths, in which at least one of the conduction paths has a metal film formed of an aluminum alloy, lower and upper barrier films sandwiching the metal film and formed of a conductive substance selected from the group consisting of a refractory metal silicide, a refractory metal and a refractory metal alloy.

BRIEF DESCRIPTION OF THE DRAWINGS

The features and advantages of a semiconductor device according to the present invention will be more clearly understood from the following description taken in conjunction with the accompanying drawings in which.

DESCRIPTION OF THE PREFERRED EMBODIMENT

First Embodiment

Figure 1:
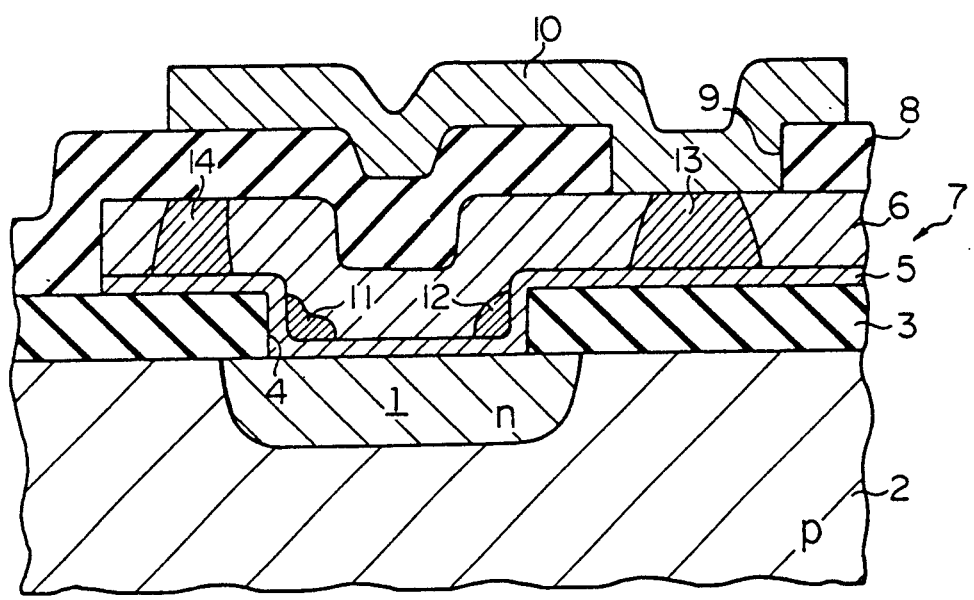
FIG. 1 is a cross sectional view showing the structure of a prior art semiconductor device having an aluminum alloy wiring associated with a single barrier film.
Figure 2:
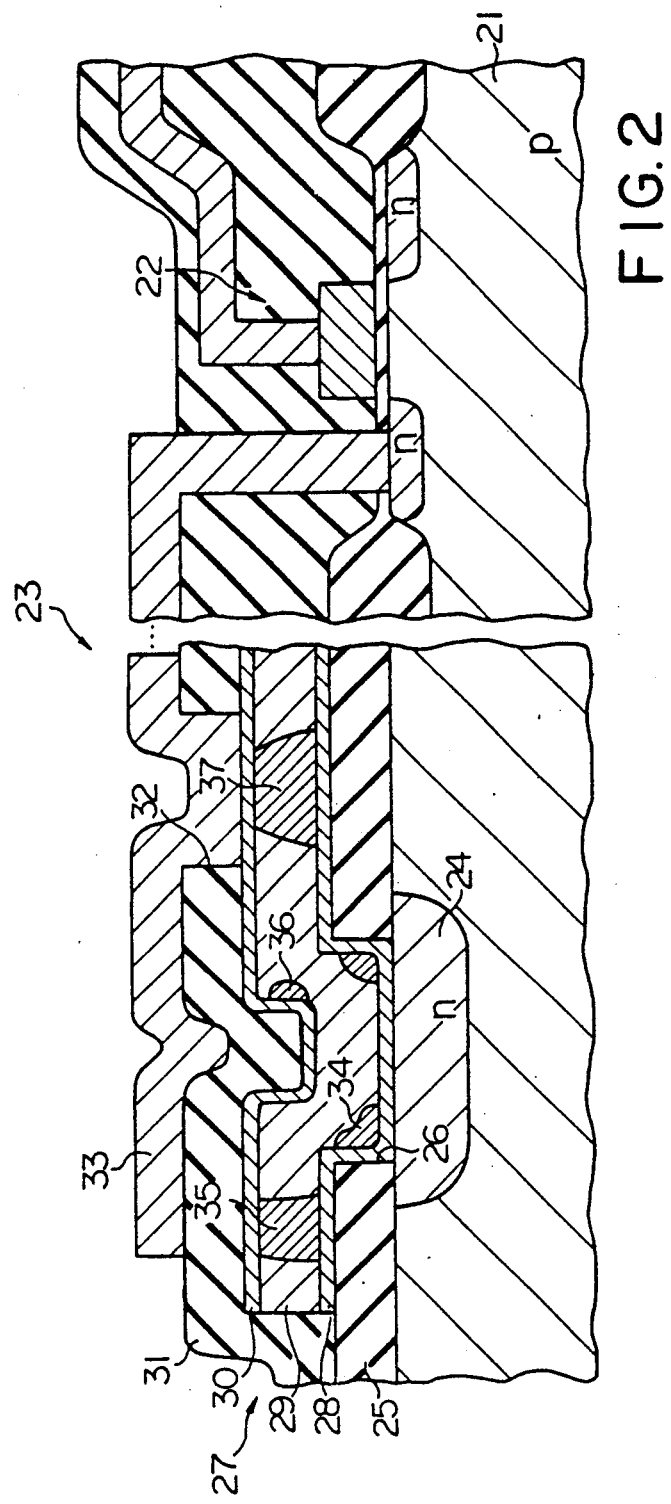
FIG. 2 is a cross sectional view showing the structure of a semiconductor device embodying the present invention.

Referring to FIG. 2 of the drawings, a semiconductor device is fabricated on a p-type single crystalline silicon substrate 21, and comprises a plurality of field effect transistors (one of which is designated by reference numeral 22) and a multi level wiring structure 23.

The multi level wiring structure 23 is implemented by a plurality of conduction paths and insulating films inserted between the conduction paths. In this instance, the lowest conduction path is an n-type impurity region 24 formed in the silicon substrate 21. The major surface of the silicon substrate 21 and, accordingly, the n-type impurity region 24 are covered with the lowest insulating film 25 of silicon oxide, and a contact window 26 is formed in the lowest insulating film 25 for exposing the n-type impurity region.

An intermediate conduction path 27 is in contact with the n-type impurity region 24 through the contact window 26, and comprises a lower barrier film 28, a metal film 29 and an upper barrier film 30. In this instance, the metal film is formed of an aluminum-silicon alloy, and the silicon content is of the order of 1% by weight. However, aluminum may be available for the metal film 29. Moreover, the metal film 29 may be formed of an aluminum alloy containing one or more substances selected from the group consisting of silicon, copper and titanium in another implementation. The lower and upper barrier films 28 and 30 are formed of a refractory metal silicide such as $TiSi_2$, $MoSi_x$ or $WSi_x$, however, a titanium, tungsten or a titanium-tungsten alloy is available for formation of either upper or lower barrier film. In the fabrication process of the semiconductor device, the molybdenum silicide is, by way of example, is sputtered on the entire surface of the structure, and the aluminum-silicon alloy and the molybdenum silicide are successively deposited on the lower molybdenum silicide film by using sputtering techniques. The silicide film, the aluminum alloy film and the silicide film thus laminated are then patterned through the usual lithographic techniques so that the intermediate conduction path 27 is completed on the insulating film 25.

A phosphosilicate glass is deposited over the entire surface of the structure, and serves as an inter-level insulating film 31 covering the intermediate conduction path 27. In the inter-level insulating film 31 is formed a contact window 32 exposing a part of the upper barrier film 30, and an upper conduction path 33 of aluminum is provided on the inter-level insulating film 31. The upper conduction path 33 penetrates the contact window 32 and is brought into contact with the upper barrier film 30. Although the structure shown in FIG. 2 is covered with a passivation film, the passivation film is omitted from the structure for the sake of simplicity.

When the structure fabricated on the silicon substrate 21 is subjected to a heat treatment for improving the conductivity at 350 degrees to 550 degrees in centigrade, the silicon is recrystallized, and undesirable silicon precipitates 34 to 37 take place in the metal film 29. The silicon precipitate 34 is produced along the periphery of the contact window 26, and the silicon precipitate 37 is located beneath the contact window 32. However, neither of the silicon precipitates 34 and 37 never deteriorate the ohmic contacts between the intermediate conduction path 27 and the lower and upper conduction paths 24 and 33, because the lower and upper barrier films 28 and 30 prevent the lower and upper conduction paths 24 and 33 from directly contacting the silicon precipitates 34 and 37, respectively. Moreover, since the lower and upper barrier films 28 and 30 permit the current to flow along the intermediate conduction path 27, undesirable hillock and, accordingly, electro-migration hardly takes place in the intermediate conduction path 27. This imparts a prolong service time period to the semiconductor device.

Second Embodiment

Figure 3:
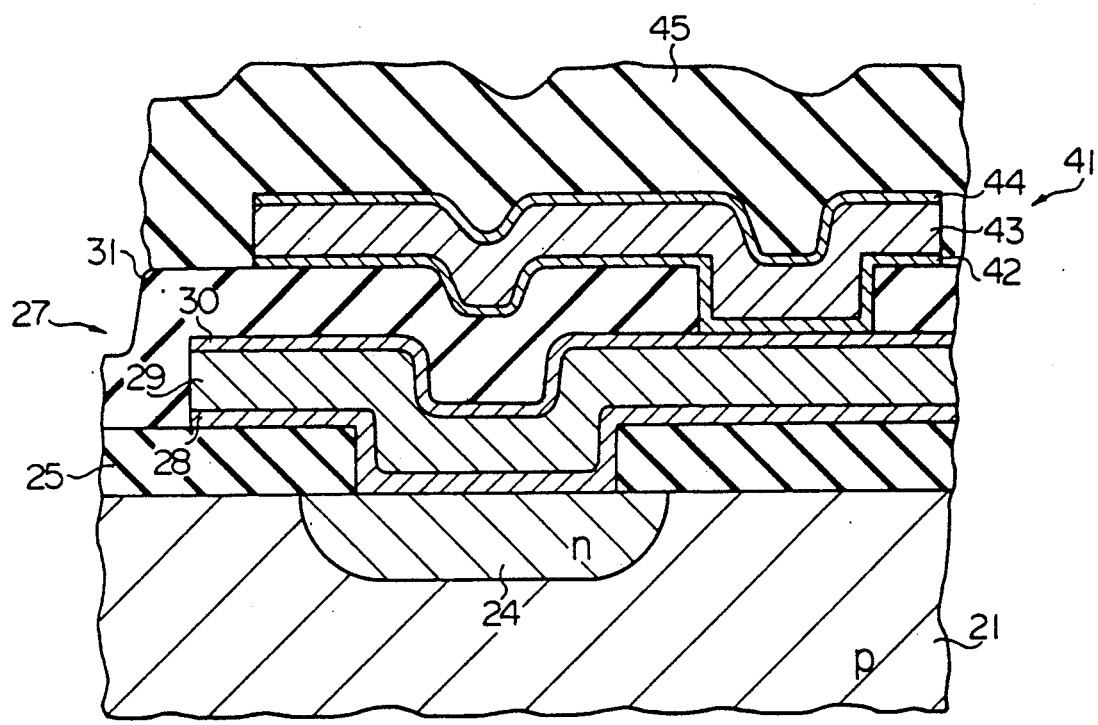
FIG. 3 is a cross sectional view showing the structure of another semiconductor device embodying the present invention.

Turning to FIG. 3 of the drawings, another multi level wiring structure incorporated in a semiconductor device is illustrated. The multi level wiring structure shown in FIG. 3 is similar to that shown in FIG. 2 with the exception of an upper conduction path 41, so that the corresponding films and paths are designated by the same reference numerals used in FIG. 2 without any detailed description.

The upper conduction path 41 comprises a lower barrier film 42, a metal film 43 and an upper barrier film 44, and the metal film is formed of an aluminum-silicon alloy. The lower and upper barrier films 42 and 44 are made of a refractory metal silicide. The lower and upper barrier films 42 and 44 are identical in material with each other, however, these films may be different in material in another implementation. A passivation film 45 is provided over the upper conduction path 41 for the sake of protection use.

As will be understood from the foregoing description, the multi-film structure according to the present invention is conducive to provision of a reliable conduction path even though undesirable recrystallized silicon precipitates takes place therein. Moreover, the multi level wiring structure having the metal film 43 sandwiched between the two barrier films 42 and 43 is resistive against the electron migration phenomenon rather than a two level structure.

Although particular embodiment of the present invention have been shown and described, it will be obvious to those skilled in the art that various changes and modifications may be made without departing from the spirit and scope of the present invention.

What is claimed is:

1. A semiconductor device fabricated on a semiconductor substrate of a first conductivity type and having at least a transistor and a multi level wiring structure, said multi level wiring structure comprising a plurality of conductive paths, and a plurality of insulating layers of silicon oxide, each inserted between two of said conductive paths and having a contact window for providing an inter level conductive path between aforesaid two of the conductive paths, in which at least one of said conductive paths has a metal film formed of a substance selected from the group consisting of aluminum and an aluminum alloy, lower and upper barrier films sandwiching the metal film and formed of a refractory metal silicide, said lower and upper barrier films being directly held in contact with said metal film so as to provide an auxiliary conductive path.

2. A semiconductor device fabricated on a semiconductor substrate of a first conductivity type and having at least a transistor and a multi level wiring structure, said multi level wiring structure comprising a plurality of conductive paths, and a plurality of insulating layers of silicon oxide, each inserted between two of said conductive paths and having a contact window for providing an inter level conduction path between aforesaid two of the conductive paths, in which at least one of said conductive paths has a metal film formed of an aluminum alloy containing silicon, lower and upper barrier films sandwiching the metal film and formed of a refractory metal silicide, said lower and upper barrier films being directly held in contact with said metal film so as to provide an auxiliary conductive path.

3. A semiconductor device as set forth in claim 2, in which the lowest conduction path is implemented by an impurity region formed in said semiconductor substrate and having a second conductivity type opposite to said first conductivity type.

4. A semiconductor device as set forth in claim 3, in which said at least one of the conduction paths is in contact with said impurity region.

5. A semiconductor device as set forth in claim 4, in which said semiconductor substrate is formed of a single crystalline silicon.

6. A semiconductor device as set forth in claim 5, in which said aluminum alloy contains aluminum and silicon.

7. A semiconductor device as set forth in claim 6, in which said aluminum alloy further contains at least one substance selected from the group consisting of copper and titanium.

8. A semiconductor device as set forth in claim 7, in which said conductive refractory metal silicide is selected from the group consisting of a tungsten silicide and a molybdenum silicide.

9. A semiconductor device as set forth in claim 7, in which said first conductivity type is imparted by a p-type dopant and said second conductivity type is imparted by an n-type dopant.

10. A semiconductor device as set forth in claim 2, in which aforesaid one of the conduction paths is implemented by an intermediate wiring layer sandwiched between said two of the insulating layers, and in which said two of the insulating layers have respective contact windows for providing inter level conduction paths between aforesaid one of the conduction paths and lower and upper conduction paths, respectively.

11. A multi level wiring structure incorporated in a semiconductor device fabricated on a semiconductor substrate, comprising:
    (a) a plurality of conductive paths, and
    (b) a plurality of insulating layers of silicon oxide, each inserted between two of said conductive paths and having a contact window for providing an inter level conduction path between aforesaid two of the conduction paths, in which at least one of said conduction paths has a metal film formed of an aluminum alloy, lower and upper barrier films sandwiching the metal film and formed of tungsten silicide, said lower and upper barrier films being directly held in contact with said metal film so as to provide an auxiliary conductive path.

12. In an improved semiconductor device of the type that includes a semiconductor substrate of a first conductivity type, a first insulating film formed on the semiconductor substrate and having a first contact window formed therein, an impurity region of a second conductivity type opposite to the first conductivity type formed in the semiconductor substrate beneath the first contact window, an intermediate conduction path formed above the first insulating film so as to contact the impurity region through the first contact window, a second insulating film formed on the intermediate conduction path and having a contact window formed therein, and an upper conduction path formed on the second insulating film so as to contact the intermediate conduction path through the second contact window, the improvement comprising:
    lower and upper barrier films formed of a conductive substance sandwiching the intermediate conduction path, the barrier films being formed of a refractory metal silicide.

13. The improved semiconductor device of claim 12, the improvement further comprising:
    lower and upper barrier films formed of a conductive substance sandwiching the upper conduction path, the barrier films being formed of a refractory metal silicide.

14. An improved conduction path that is used in a semiconductor device to make ohmic contact with at least one other conduction path via contact windows formed in insulating layers that separate the conduction paths, the improved conduction path comprising:
    a metal film formed from the group consisting of aluminum and an aluminum alloy; and
    lower and upper barrier films formed of a conductive substance and sandwiching the metal film, the barrier films being formed of a refractory metal silicide.

15. The improved conduction path of claim 14 wherein the metal film is an aluminum alloy that contains aluminum and silicon.

16. The improved conduction path of claim 15 wherein the aluminum alloy contains at least one substance selected from the group consisting of copper and titanium.

17. The improved conduction path of claim 16 wherein the refractory metal silicide is selected from the group consisting of a tungsten silicide and a molybdenum silicide.

18. The improved conduction path of claim 16 wherein the refractory metal silicide is selected from the group consisting of tungsten and titanium.

19. A multilevel wiring structure incorporated in a semiconductor device fabricated on a semiconductor substrate, comprising:
    (a) a plurality of conductive paths, and
    (b) a plurality of insulating layers of silicon oxide, each inserted between two of said conductive paths and having a contact window for providing an inter-level conduction path between aforesaid two of the conduction paths, in which at least one of said conduction paths has a metal film formed of an aluminum alloy containing silicon, lower and upper barrier films sandwiching the metal film and formed of titanium silicide, said lower and upper barrier films being directly held in contact with said metal film to provide an auxiliary conductive path.

* * * * *